US012575452B2

(12) United States Patent
Huang et al.

(10) Patent No.: US 12,575,452 B2
(45) Date of Patent: Mar. 10, 2026

(54) DISPLAY MODULE AND MANUFACTURING METHOD THEREFOR, AND LED DISPLAY PANEL AND LED DISPLAY APPARATUS

(71) Applicant: HCP TECHNOLOGY CO., LTD., Dongguan (CN)

(72) Inventors: Zhiqiang Huang, Dongguan (CN); Wuwen Pang, Dongguan (CN); Wenrong Zhuang, Dongguan (CN); Ming Sun, Dongguan (CN); Jingquan Lu, Dongguan (CN)

(73) Assignee: HCP TECHNOLOGY CO., LTD., Dongguan (CN)

( * ) Notice: Subject to any disclaimer, the term of this patent is extended or adjusted under 35 U.S.C. 154(b) by 546 days.

(21) Appl. No.: 18/015,371

(22) PCT Filed: Aug. 20, 2020

(86) PCT No.: PCT/CN2020/110332
§ 371 (c)(1),
(2) Date: Jan. 10, 2023

(87) PCT Pub. No.: WO2022/011780
PCT Pub. Date: Jan. 20, 2022

(65) Prior Publication Data
US 2023/0282623 A1    Sep. 7, 2023

(30) Foreign Application Priority Data
Jul. 13, 2020    (CN) .......................... 202010668892.8

(51) Int. Cl.
H01L 25/075    (2006.01)
G09F 9/33    (2006.01)
(Continued)

(52) U.S. Cl.
CPC ......... H01L 25/0753 (2013.01); H10H 20/84 (2025.01); H10H 20/853 (2025.01); H10H 20/034 (2025.01); H10H 20/0362 (2025.01)

(58) Field of Classification Search
CPC .. H01L 25/0753; H10H 20/853; H10H 20/84; H10H 20/855; H10H 20/0363; H10K 59/18; H10K 50/865
See application file for complete search history.

(56) References Cited

U.S. PATENT DOCUMENTS 10,651,265 B2    5/2020    Park
2016/0216819 A1    7/2016    Choi et al.
(Continued)

FOREIGN PATENT DOCUMENTS

CN    206021820 U    3/2017
CN    108260361 A    7/2018
(Continued)

OTHER PUBLICATIONS

Extended European Search Report for European Application No. 20945425.5, dated Jun. 18, 2024 (Jun. 18, 2024)—7 pages.
(Continued)

*Primary Examiner* — Antonio B Crite
(74) *Attorney, Agent, or Firm* — CM Law; Stephen J. Weed

(57) ABSTRACT

Provided are a display module and a manufacturing method therefor, an LED display panel and an LED display apparatus. The display module includes a board, a pixel unit array, an encapsulation layer and a black ink layer. The board has a front surface and a back surface. The pixel unit array is disposed on the front surface of the board. The encapsulation layer covers the region where the pixel unit array is located. A side surface of the encapsulation layer
(Continued)

forms a slope surface at an edge of the front surface of the board. The black ink layer covers the encapsulation layer.

11 Claims, 4 Drawing Sheets

(51) Int. Cl.

| | |
|---|---|
| *H10H 20/01* | (2025.01) |
| *H10H 20/84* | (2025.01) |
| *H10H 20/853* | (2025.01) |
| *H10H 20/855* | (2025.01) |
| *H10K 50/86* | (2023.01) |
| *H10K 59/18* | (2023.01) |

(56) References Cited

U.S. PATENT DOCUMENTS

| | | | |
|---|---|---|---|
| 2018/0190631 A1* | 7/2018 | Kim | G02F 1/13336 |
| 2018/0366625 A1* | 12/2018 | Nakano | G09F 9/33 |
| 2020/0058624 A1 | 2/2020 | Su et al. | |
| 2020/0388636 A1* | 12/2020 | Yueh | H01L 25/0655 |

FOREIGN PATENT DOCUMENTS

| | | | |
|---|---|---|---|
| CN | 108336204 A | | 7/2018 |
| CN | 208045002 | * | 11/2018 |
| CN | 208045002 U | | 11/2018 |
| CN | 110770920 A | | 2/2020 |
| CN | 210666266 U | | 6/2020 |
| CN | 212323026 U | | 1/2021 |
| EP | 3343274 A2 | | 7/2018 |

OTHER PUBLICATIONS

International Search Report and Written Opinion Application No. PCT/CN2020/110332, dated Feb. 20, 2021, pp. 1-5.

First Chinese Office Action for Chinese Application No. 202010668892. 8, dated May 29, 2025 (May 29, 2025)—7 pages (English translation—13 pages).

* cited by examiner 140   130   120   133   132   b2   b1   110

133
132
110

DISPLAY MODULE AND MANUFACTURING METHOD THEREFOR, AND LED DISPLAY PANEL AND LED DISPLAY APPARATUS

CROSS-REFERENCE TO RELATED APPLICATION(S)

This is a national stage application filed under 37 U.S.C. 371 based on International Patent Application No. PCT/CN2020/110332, filed Aug. 20, 2020, which claims priority to Chinese Patent Application No. 202010668892.8 filed with the China National Intellectual Property Administration (CNIPA) on Jul. 13, 2020, the disclosures of both of which are incorporated herein by reference in their entireties.

TECHNICAL FIELD

The present disclosure relates to the field of display technology, for example, a display module and a manufacturing method therefor, a light emitting diode (LED) display panel and an LED display apparatus.

BACKGROUND

With the continuous development of society, the LED industry becomes one of the most active industries, and LED display apparatus products gradually enter many fields of society and life. At the same time, with the innovation and development of LED display apparatus technology, a fine-pitch LED display module with high resolution per unit area has become a mainstream product of an LED display apparatus. The display module can display graphic images and videos with higher clarity and can also display more videos and images. Especially in the application of image stitching, the display module can implement any large area stitching.

Generally, an LED display apparatus is stitched by multiple LED display modules. However, there must be joints when the multiple LED display modules are stitched. Light is prone to transmit from the joints. In particular, the light emitted by two rows or two columns of LEDs adjacent to a joint is more prone to transmit from the joint. When viewed from a side, the light emission intensities at the joints are large. As a result, after the apparatus is assembled, the occurrence of yellow or cyan or pink or white bright lines adjacent to the joints is directly caused when observation is performed from a large viewing angle.

SUMMARY

The present disclosure provides a display module and a manufacturing method therefor, an LED display panel and an LED display apparatus to alleviate the occurrence of yellow or cyan or pink or white bright lines caused by light leakage at joints after display modules are assembled.

An embodiment of the present disclosure provides a display module. The display module includes a board, a pixel unit array, an encapsulation layer and a black ink layer.

The board has a front surface and a back surface.

The pixel unit array is disposed on the front surface of the board.

The encapsulation layer covers the region where the pixel unit array is located. A side surface of the encapsulation layer forms a slope surface at an edge of the front surface of the board.

The black ink layer covers the encapsulation layer.

An embodiment of the present disclosure provides a manufacturing method for a display module. The method includes the steps below.

The board is provided. The board has the front surface and the back surface.

The pixel unit array is formed on the front surface of the board.

The encapsulation layer is formed on the region where the pixel unit array is located.

The slope surface is formed on the side surface of the encapsulation layer located at the edge of the front surface of the board.

The black ink layer is formed on the encapsulation layer.

An embodiment of the present disclosure provides an LED display panel. The LED display panel includes a plurality of display modules arranged in an array.

An embodiment of the present disclosure provides an LED display apparatus. The LED display apparatus includes a plurality of LED display panels arranged in an array.

DETAILED DESCRIPTION

Figures 1, 2:
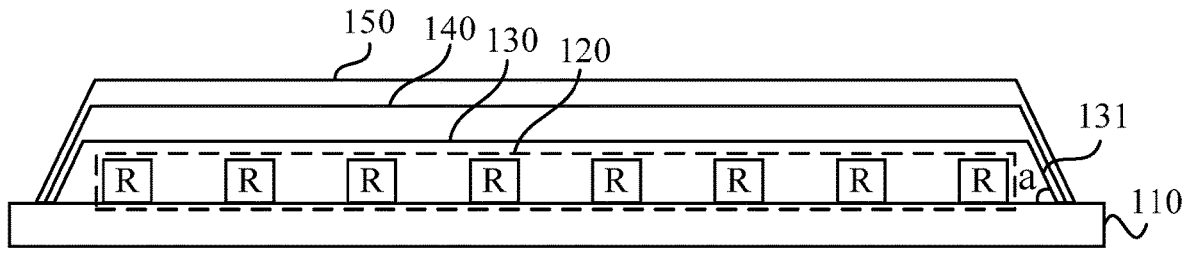
FIG. 1 is a sectional view of a display module according to embodiment one of the present disclosure.
FIG. 2 is a top view of a display module according to embodiment one of the present disclosure.

The present disclosure is described below in conjunction with drawings and embodiments. The embodiments described herein are merely intended to explain and not to limit the present disclosure. For each of description, only part, not all, of structures related to the present disclosure are illustrated in the drawings.

Embodiment One

FIG. 1 is a sectional view of a display module according to embodiment one of the present disclosure. FIG. 2 is a top view of a display module according to embodiment one of the present disclosure. Referring to FIG. 1, the display module includes a board 110, a pixel unit array 120, an encapsulation layer 130 and a black ink layer 140. The board 110 has a front surface and a back surface. The pixel unit array 120 is disposed on the front surface of the board 110. The encapsulation layer 130 covers the region where the pixel unit array 120 is located. The encapsulation layer 130 is transparent or translucent. A side surface of the encapsulation layer 130 forms a slope surface 131 at an edge of the front surface of the board 110. The black ink layer 140 covers the encapsulation layer 130. When the black ink layer 140 covers the encapsulation layer 130, the slope surface 131 makes the black ink more fully contact with the encapsulation layer 130.

Referring to FIG. 2, the slope 131 includes a first side 1311 in contact with the board 110 and a second side 1312 not in contact with the board. In a direction parallel to the surface of the board 110, the second side 1312 is more adjacent to the edge of the pixel unit array 120 relative to the first side 1311. The black ink layer 140 covers the encapsulation layer 130.

The board 110 may be a printed circuit board (PCB) (including FR4, FR4+BT-like, BT, BT-like or a flexible printed circuit (FPC)) or a glass board. A driver chip and a connector are formed on the back surface of the board 110. The driver chip is connected to the board by a surface mounted technology (SMT) process, or the board includes a thin film transistor (TFT) array. The pixel unit array 120 includes multiple pixel units. Each pixel unit includes three sub-pixels, such as a red LED, a green LED and a blue LED. The first side 1311 is a boundary line where the slope surface 131 intersects the board 110.

The set included angle a between the slope surface 131 and the board 110 is smaller than 90 degrees. Compared with the case where the slope surface 131 is perpendicular to the board 110, the set included angle a is set to be smaller than 90 degrees. In one aspect, part of the light irradiating on the slope surface 131 is refracted to the board 110 to reduce the light emitted laterally, thereby reducing the light leakage at a joint after display modules are stitched. In another aspect, the slope surface 131 has a certain inclination angle so that the black ink layer 140 can cover the entire encapsulation layer 130, that is, the black ink layer 140 may also cover the slope surface 131 at the joint. Since the black ink layer 140 has a certain effect of reducing light transmission, the black ink layer 140 covers the slope surface 131 to reduce light transmission at the joint. Additionally, the slope surface 131 has a certain inclination angle, so that the subsequently formed film such as the black ink layer 140 can uniformly cover the slope surface 131. In this manner, the surface of the entire encapsulation layer 130 is completely covered with the black ink layer material. Thus, the light emitting uniformity of the display module is better, and the problem that locally emitted light is too strong is avoided. Since the light emitting uniformity of the display module is good, the display module has high dislocation compatibility. Thus, apparatus assembly production is facilitated, and the efficiency and the yield of an assembled apparatus are improved.

Optionally, the slope surface 131 is a chamfer formed by half chamfering the encapsulation layer 130 or fully chamfering the encapsulation layer 130.

Optionally, the angle range of a chamfer is 1 degree to 89 degrees.

Optionally, the vertical projection of the slope surface 131 on the board 110 does not overlap the region where the pixel unit array 120 is located.

Optionally, referring to FIG. 1, the LED display module also includes a memory coating layer 150 covering the black ink layer 140 and configured to protect the black ink layer 140.

The memory coating layer 150 is formed on the black ink layer 140 by spraying to protect the black ink layer 140 from being scratched and remaining contact fingerprints.

Optionally, the material of the encapsulation layer 130 is a transparent epoxy resin doped with the diffusion powder or a silicone resin doped with the diffusion powder.

In the solution of this embodiment, the set included angle a between the slope surface 131 and the board 110 is set to be smaller than 90 degrees. In one aspect, the light emitting angle of the LED at the edge of the pixel unit array 120 is changed, so that the part of the light irradiating on the slope surface 131 is refracted to the board 110 to reduce the light emitted laterally, thereby reducing the light leakage at the joint after the display modules are stitched. In another aspect, the black ink layer may cover the slope surface 131 at the joint, thereby reducing the light transmission at the joint. Additionally, the slope surface 131 has a certain inclination angle, so that the subsequently formed film such as the black ink layer 140 can uniformly cover the slope surface 131. In this manner, the surface of the entire encapsulation layer 130 is completely covered with the black ink layer material. Thus, the light emitting uniformity of the display module is better, and the problem that locally emitted light is too strong is avoided. Since the light emitting uniformity of the display module is good, the display module has high dislocation compatibility. Thus, the apparatus assembly production is facilitated, and the efficiency and the yield of the assembled apparatus are improved.

Embodiment Two

Figures 3, 4:
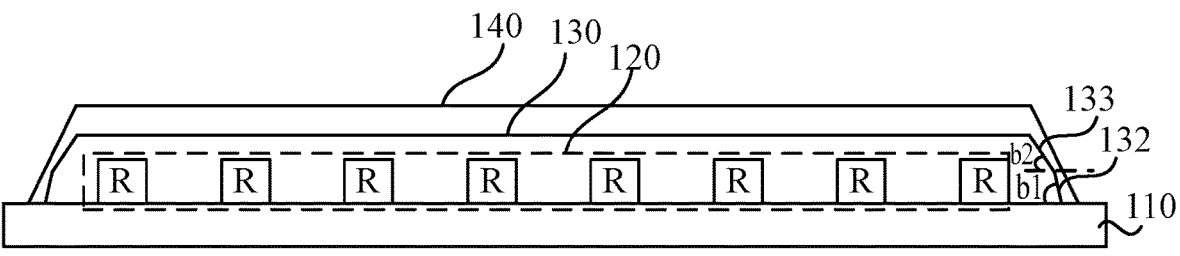
FIG. 3 is a sectional view of a display module according to embodiment two of the present disclosure.
FIG. 4 is a top view of a display module according to embodiment two of the present disclosure.
Figure 5:
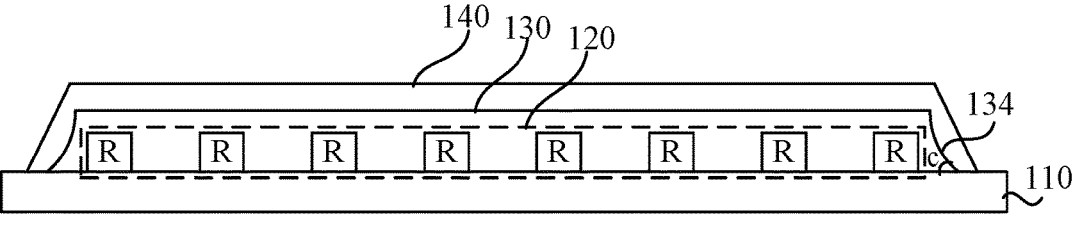
FIG. 5 is a sectional view of another display module according to embodiment two of the present disclosure.

FIG. 3 is a sectional view of a display module according to embodiment two of the present disclosure. FIG. 4 is a top view of a display module according to embodiment two of the present disclosure. FIG. 5 is a sectional view of another display module according to embodiment two of the present disclosure. On the basis of the preceding embodiment, referring to FIGS. 3 and 4, the slope surface 131 includes at least two sub-slope-surfaces, such as a first sub-slope-surface 132 and a second sub-slope-surface 133 of FIGS. 3 and 4. In a direction from the board 110 to the black ink layer 140, the at least two sub-slope-surfaces are arranged in sequence, and the included angles between the at least two sub-slope-surfaces and the board 110 gradually decrease.

Referring to FIG. 3, the slope surface 131 includes a first sub-slope-surface 132 and a second sub-slope-surface 133. In the direction from the board 110 to the black ink layer 140, the first sub-slope-surface 132 and the second sub-slope-surface 133 are arranged in sequence. The included angle between the first sub-slope-surface 132 and the board 110 is set to b1. The included angle between the second sub-slope-surface 133 and the board 110 is set to b2. The included angle b2 between the second sub-slope-surface 133 and the board 110 is smaller than the included angle b1 between the first sub-slope-surface 132 and the board 110.

The smaller the included angle between the slope surface 131 and the board 110 is, more light irradiating on the slope surface 131 is refracted to the board 110. However, when the included angle between the slope surface 131 and the board 110 is too small, to ensure that the thickness of the encapsulation layer 130 is not changed and to ensure the encapsulation effect, the larger the distance between the boundary of the encapsulation layer 130 and the boundary of the pixel unit array (an LED array layer) 120 is, that is, the larger the bezel of the display module is. The slope surface 131 is configured to include at least two sub-slope-surfaces (such as the first sub-slope-surface 132 and the second sub-slope-surface 133). Compared with the slope surface 131 shown in FIGS. 1 and 2, in the case where more light irradiating on the slope surface 131 is ensured to be refracted to the board 110, the light emitting angle is greatly optimized, and the black ink layer 140 can cover the entire encapsulation layer 130. In this manner, light transmission is reduced, and it is ensured that the display module has a smaller bezel at the same time.

The slope surface 131 may also include multiple sub-slope-surfaces. The first sub-slope-surface is in contact with the board 110. The other sub-slope-surfaces are not in contact with the board 110. In the direction from the board 110 to the black ink layer 140, the other sub-slope-surfaces are more and more adjacent to the edge of the pixel unit array 120 in sequence. The included angle between each sub-slope-surface and the board 110 is smaller than 90 degrees. The number of sub-slope-surfaces and the angles of the sub-slope-surfaces may be set according to actual requirements of the display module. This is not limited in this embodiment.

Optionally, referring to FIG. 5, the slope surface includes a circular arc surface 134.

Referring to FIG. 5, when the slope surface includes the circular arc surface 134, the included angle between the slope surface 131 and the board 110 is the included angle between the tangent of the circular arc surface 134 and the board 110. The included angle between the circular arc surface 134 and the board 110 is set to c, and the included angle c is smaller than 90 degrees. Thus, the light-emitting angle of the LED at the edge of the pixel unit array 120 may be optimized, and the light transmission is reduced. Moreover, the black ink layer 140 can cover the entire encapsulation layer 130, thereby reducing the light transmission at the joint when the display modules are stitched. Additionally, the slope surface 131 may also include a side surface composed of at least two circular arc surfaces. The included angle between each circular arc surface and the board is smaller than 90 degrees.

FIG. 5 merely exemplarily shows that the slope surface 131 includes a circular arc surface concave to the pixel unit array 120 and is not limited to the present disclosure. In other embodiments, the slope surface 131 may also include a circular arc surface protruding in a direction away from the pixel unit array 120.

Embodiment Three

Figure 6:
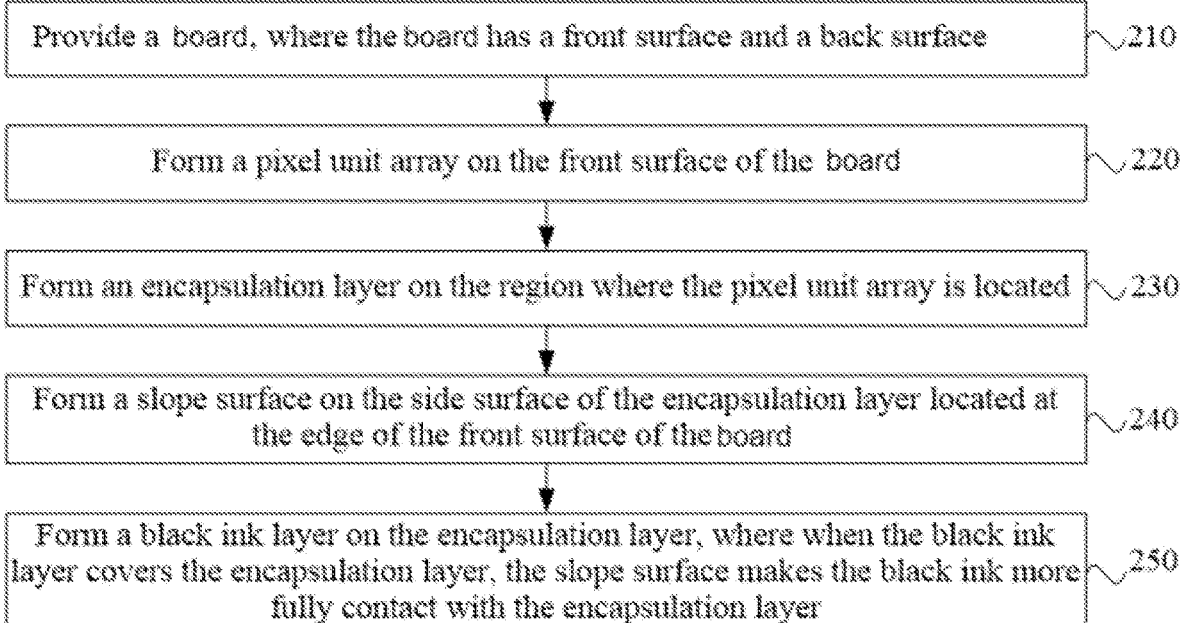
FIG. 6 is a flowchart of a manufacturing method for a display module according to embodiment three of the present disclosure.

FIG. 6 is a flowchart of a manufacturing method for a display module according to embodiment three of the present disclosure. This method is applicable to the implementation process of the display module according to any embodiment of the present disclosure. Referring to FIG. 6, the manufacturing method for a display module includes the steps below.

In step 210, the board is provided. The board has the front surface and the back surface.

The board may be the printed circuit board (PCB) (including FR4, FR4+BT-like, BT, BT-like or an FPC) or the glass board.

In step 220, the pixel unit array is formed on the front surface of the board.

LEDs are mounted on the board to form the pixel unit array.

In step 230, the encapsulation layer is formed on the region where the pixel unit array is located.

The encapsulation layer is transparent or translucent and has a flat surface after the surface of the pixel unit array is cured.

In step 240, the slope surface is formed on the side surface of the encapsulation layer located at the edge of the front surface of the board.

In step 250, the black ink layer is formed on the encapsulation layer.

When the black ink layer covers the encapsulation layer, the slope surface makes the black ink more fully contact with the encapsulation layer.

The black ink layer can be sprayed on the side of the encapsulation layer facing away from the board by spraying. Uniform spraying of the black ink layer may optimize the light emission intensity and the uniformity of the pixel unit array.

There is a set included angle between the slope surface and the board. The set included angle is smaller than 90 degrees. Thus, when multiple display modules are stitched, the spraying material of the subsequent black ink layer can be uniformly covered on the encapsulation layer at joints. In this manner, the surface of the entire encapsulation layer is completely covered with the spraying material, and the light emission intensity is uniform and consistent, thereby avoiding the problem that locally emitted light is too strong. Moreover, side light leakage at the joints is reduced, and bright lines at the joints are blurred.

Optionally, the slope surface is formed in the manners below on the side surface of the encapsulation layer located at the edge of the front surface of the board.

A milling cutter is used to cut the side surface of the encapsulation layer located at the edge of the front surface of the board to form the slope surface.

Line cut technology may also be used for cutting the side surface of the encapsulation layer located at the edge of the front surface of the board to form the slope surface.

Optionally, the encapsulation layer is formed in the manners below on the region where the pixel unit array is located.

The encapsulation layer is formed by at least one of spraying, spin coating, slot die coating, molding, film mounting or dispensing.

For example, the encapsulation layer may be formed by spraying, spin coating or slot die coating a transparent liquid adhesive and curing. Alternatively, the encapsulation layer may be formed by molding. Alternatively, the encapsulation layer may be formed by film mounting. Alternatively, the encapsulation layer may be formed by dispensing.

In the solution of this embodiment, a manufacturing method for a display module is provided. This manufacturing method includes providing the board, forming the pixel unit array on the front surface of the board, forming the encapsulation layer on the region where the pixel unit array is located, forming the slope surface on the side surface of the encapsulation layer located at the edge of the front surface of the board and forming the black ink layer on the encapsulation layer. When the black ink layer covers the encapsulation layer, the slope surface makes the black ink more fully contact with the encapsulation layer. In this manner, the light emitting angle of the LED at the joint of display modules may be optimized, and the light transmission at the joint is reduced. At the same time, the black ink layer may cover the encapsulation layer at the joint. Thus, the light transmission at the joint is reduced, and the occurrence of color lines and bright lines at the joint is alleviated.

The manufacturing method for a display module in this embodiment and the display module provided in any embodiment of the present disclosure belong to the same concept and have the corresponding effects. For technical details not described in detail in this embodiment, reference may be made to the display module provided in any embodiment of the present disclosure.

Embodiment Four

Figure 7:
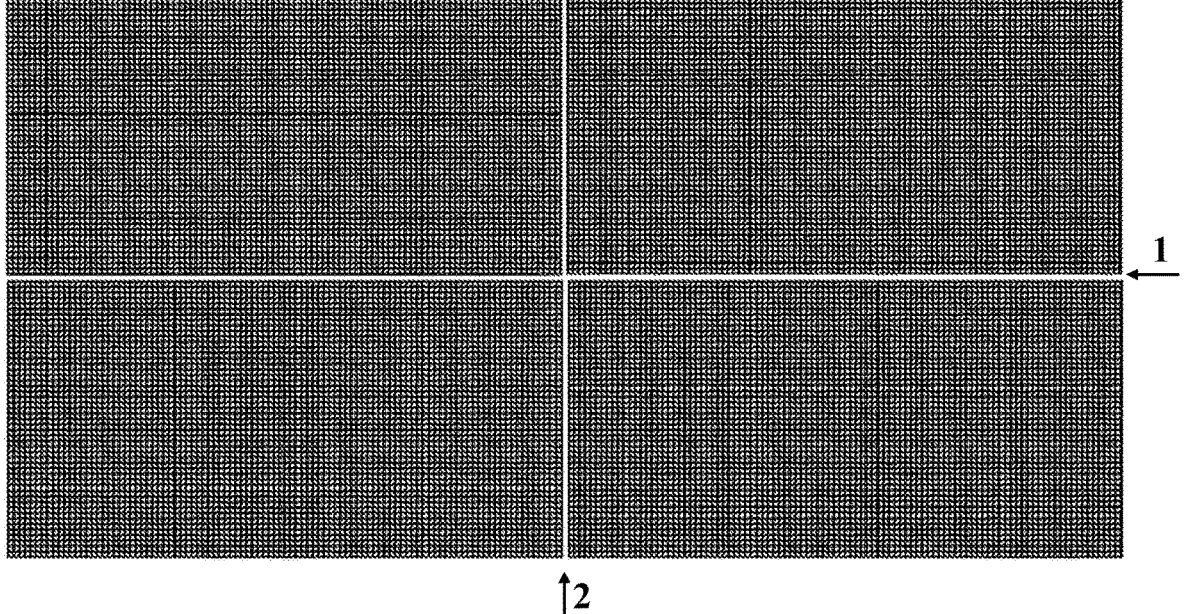
FIG. 7 is a view of an LED display panel according to embodiment four of the present disclosure.

FIG. 7 is a view of an LED display panel according to embodiment four of the present disclosure. Referring to FIG.

7, the LED display panel includes a plurality of display modules arranged in an array according to any embodiment of the present disclosure.

Referring to FIG. 7, the LED display panel is a large display panel formed by stitching a plurality of display modules. Joint 1 and joint 2 shown in FIG. 7 are formed during stitching. Generally, when the slope surface of a display module is perpendicular to the board, when stitching is performed, and when LED pixels at the edges of two stitched display modules are each arranged in a manner of R pixels, G pixels and B pixels, since the slope surfaces of the encapsulation layers at the joint of the two modules are perpendicular to the board, that is, the slope surfaces have no inclination angle, the encapsulation layers at the edges cannot be uniformly covered by subsequently formed films such as black ink layers. As a result, the light transmission intensity at the joint between the edges is large, and bright lines appear. Among the two stitched display modules, when LED pixels at the edge of one display module are R pixels, and LED pixels at the edge of the other display module are B pixels, color lines such as pink lines and yellow lines are formed at the joint between the edges. According to the display module provided by this embodiment of the present disclosure, during stitching, due to the slope surface, in one aspect, the part of the light irradiated on the slope surface is refracted to the board to reduce the light emitted laterally, thereby reducing the light leakage at the joint after the display modules are stitched, and in another aspect, the slope surface has a certain inclination angle so that the black ink layer can cover the entire encapsulation layer, that is, the black ink layer may also cover the slope surface at the joint. Since the black ink layer has a certain effect of reducing light transmission, the black ink layer covers the slope surface to reduce the light transmission at the joint. Additionally, the slope surface has a certain inclination angle, so that the subsequently formed film such as the black ink layer can uniformly cover the slope surface. In this manner, the surface of the entire encapsulation layer is completely covered with the black ink layer material. Thus, the light emitting uniformity of the display module is better, and the problem that locally emitted light is too strong is avoided. Since the light emitting uniformity of the module is good, the module has high dislocation compatibility. Thus, the apparatus assembly production is facilitated, and the efficiency and the yield of the assembled apparatus are improved.

Embodiment Five

Embodiment five of the present disclosure provides an LED display apparatus. The LED display apparatus includes a plurality of display panels arranged in an array according to any embodiment of the present disclosure.

What is claimed is:

1. A display module, comprising:
a substrate, wherein the substrate has a front surface and a back surface;
a pixel unit array, wherein the pixel unit array is disposed on the front surface of the substrate;
an encapsulation layer, wherein the encapsulation layer covers a region where the pixel unit array is located, and a side surface of the encapsulation layer forms a slope surface at an edge of the front surface of the substrate; and
a black ink layer, wherein the black ink layer covers the encapsulation layer;

wherein one of the following is satisfied:
the slope surface is a chamfer formed by half chamfering the encapsulation layer or fully chamfering the encapsulation layer;
the slope surface comprises at least two sub-slope-surfaces, and the at least two sub-slope-surfaces are arranged in sequence; or
the display module further comprises a memory coating layer, wherein the memory coating layer covers the black ink layer and is configured to protect the black ink layer.

2. The display module according to claim 1, wherein in a case where the slope surface is the chamfer formed by half chamfering the encapsulation layer or fully chamfering the encapsulation layer, an angle range of the chamfer is 1 degree to 89 degrees.

3. The display module according to claim 1, wherein in a case where the slope surface is the chamfer formed by half chamfering the encapsulation layer or fully chamfering the encapsulation layer or the display module further comprises the memory coating layer, the slope surface comprises a circular arc surface.

4. The display module according to claim 1, wherein a vertical projection of the slope surface on the substrate does not overlap the region where the pixel unit array is located.

5. A manufacturing method for a display module, comprising:
providing a substrate, wherein the substrate has a front surface and a back surface;
forming a pixel unit array on the front surface of the substrate;
forming an encapsulation layer on a region where the pixel unit array is located;
forming a slope surface on a side surface of the encapsulation layer located at an edge of the front surface of the substrate; and
forming a black ink layer on the encapsulation layer;
wherein forming the slope surface on the side surface of the encapsulation layer located at the edge of the front surface of the substrate comprises:
using a milling cutter to cut the side surface of the encapsulation layer located at the edge of the front surface of the substrate to form the slope surface.

6. The method according to claim 5, wherein forming the encapsulation layer on the region where the pixel unit array is located comprises:
forming the encapsulation layer by at least one of spraying, spin coating, slot die coating, die pressing, film mounting or dispensing.

7. A light emitting diode (LED) display module, comprising a plurality of display modules, wherein the plurality of display modules are arranged in an array; and
wherein a display module of the plurality of display modules comprises:
a substrate, wherein the substrate has a front surface and a back surface;
a pixel unit array, wherein the pixel unit array is disposed on the front surface of the substrate;
an encapsulation layer, wherein the encapsulation layer covers a region where the pixel unit array is located, and a side surface of the encapsulation layer forms a slope surface at an edge of the front surface of the substrate; and
a black ink layer, wherein the black ink layer covers the encapsulation layer;

wherein one of the following is satisfied:

the slope surface is a chamfer formed by half chamfering the encapsulation layer or fully chamfering the encapsulation layer;

the slope surface comprises at least two sub-slope-surfaces, and the at least two sub-slope-surfaces are arranged in sequence; or the display module further comprises a memory coating layer, and the memory coating layer covers the black ink layer and is configured to protect the black ink layer.

8. A light emitting diode (LED) display screen, comprising a plurality of LED display modules according to claim 7, wherein the plurality of LED display modules are arranged in an array.

9. The LED display module according to claim 7, wherein in a case where the slope surface is the chamfer formed by half chamfering the encapsulation layer or fully chamfering the encapsulation layer, an angle range of the chamfer is 1 degree to 89 degrees.

10. The LED display module according to claim 7, wherein in a case where the slope surface is the chamfer formed by half chamfering the encapsulation layer or fully chamfering the encapsulation layer or the display module further comprises the memory coating layer, the slope surface comprises a circular arc surface.

11. The LED display module according to claim 7, wherein a vertical projection of the slope surface on the substrate does not overlap the region where the pixel unit array is located.

* * * * *